(12) United States Patent
Miki

(10) Patent No.: US 8,987,902 B2
(45) Date of Patent: Mar. 24, 2015

(54) SEMICONDUCTOR DEVICE, SEMICONDUCTOR PACKAGE, AND METHOD FOR MANUFACTURING SEMICONDUCTOR DEVICE

(71) Applicant: Shinko Electric Industries Co., Ltd., Nagano-ken (JP)

(72) Inventor: Syota Miki, Nagano (JP)

(73) Assignee: Shinko Electric Industries Co., Ltd., Nagano-ken (JP)

( * ) Notice: Subject to any disclaimer, the term of this patent is extended or adjusted under 35 U.S.C. 154(b) by 0 days.

(21) Appl. No.: 13/716,719

(22) Filed: Dec. 17, 2012

(65) Prior Publication Data
US 2013/0161813 A1 Jun. 27, 2013

(30) Foreign Application Priority Data
Dec. 22, 2011 (JP) .................... 2011-282076

(51) Int. Cl.
*H01L 23/498* (2006.01)
*H01L 21/48* (2006.01)
*H01L 21/768* (2006.01)
*H01L 23/48* (2006.01)

(52) U.S. Cl.
CPC ........ *H01L 23/49811* (2013.01); *H01L 21/486* (2013.01); *H01L 21/76898* (2013.01); *H01L 23/481* (2013.01); *H01L 23/49816* (2013.01); *H01L 2224/16225* (2013.01); *H01L 2224/32225* (2013.01); *H01L 2224/73204* (2013.01); *H01L 2924/15311* (2013.01); *H01L 2924/01322* (2013.01)
USPC ........... 257/737; 257/448; 257/329; 257/330; 257/331; 257/332; 257/520; 257/499; 257/642; 257/643

(58) Field of Classification Search
CPC ............... H01L 23/49811; H01L 2224/16225; H01L 2224/48227; H01L 2224/73204; H01L 24/81; H01L 2224/05572; H01L 2224/48247; H01L 21/76885; H01L 2224/0401; H01L 2224/13007; H01L 23/481; H01L 21/486; H01L 23/498; H01L 21/48
USPC ......... 257/737, 772, 448, 329, 330, 331, 332, 257/407, 520, 499, 334, 337, 40, 642, 643, 257/688
See application file for complete search history.

(56) References Cited

U.S. PATENT DOCUMENTS

| 7,528,476 | B2* | 5/2009 | Ito | 257/689 |
| 2007/0023888 | A1* | 2/2007 | Fujii | 257/698 |
| 2008/0299768 | A1* | 12/2008 | Yamano | 438/667 |
| 2009/0108391 | A1* | 4/2009 | Kuriyama | 257/448 |
| 2010/0248425 | A1* | 9/2010 | Hashimoto | 438/113 |

FOREIGN PATENT DOCUMENTS

JP 2006-179562 A 6/2006

* cited by examiner

*Primary Examiner* — Chuong A Luu
(74) *Attorney, Agent, or Firm* — Wolf, Greenfield & Sacks, P.C.

(57) ABSTRACT

A semiconductor device includes a semiconductor substrate. The semiconductor substrate includes a first surface, a second surface, and a through hole that extends through the semiconductor substrate from the first surface to the second surface. An insulating layer covers the first surface and includes an opening at a location facing the through hole. An insulating film covers an inner wall of the through hole and an inner wall of the opening. A through electrode is formed in the through hole and the opening that are covered by the insulating film. A first connecting terminal is formed integrally with the through electrode to cover one end of the through electrode exposed from the insulating layer. The first connecting terminal has a larger size than the through electrode as viewed from above.

8 Claims, 10 Drawing Sheets

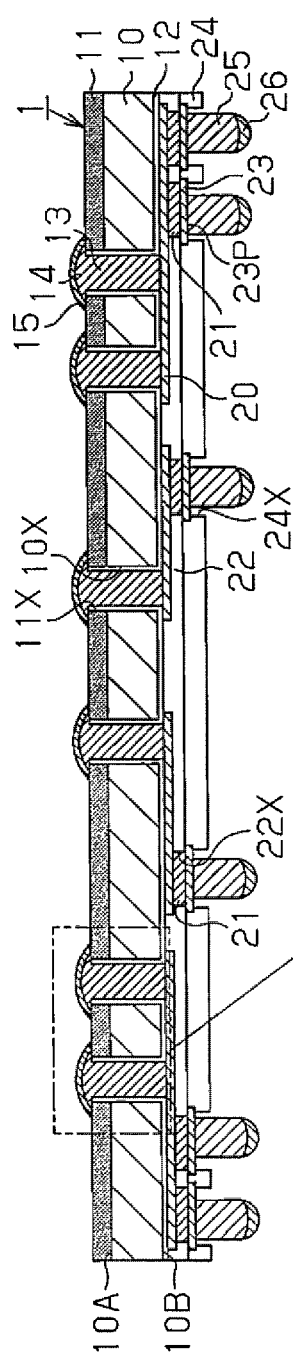
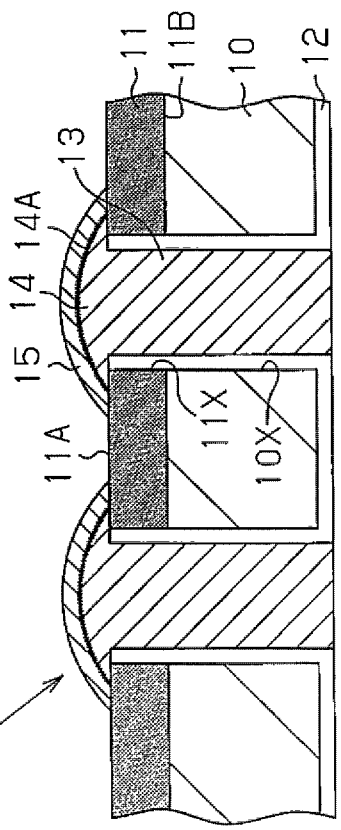
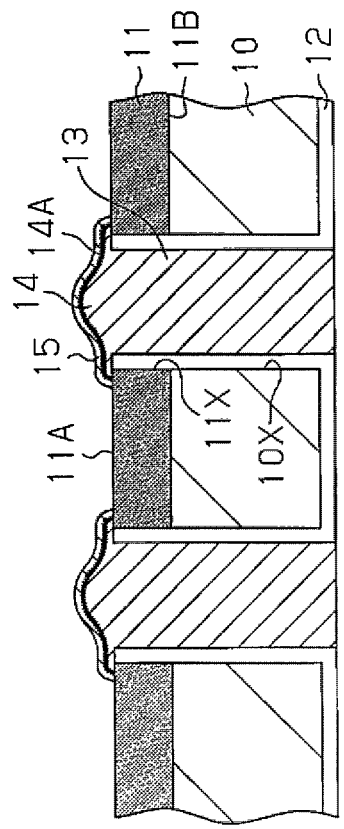
Fig.1A
Fig.1B
Fig.1C

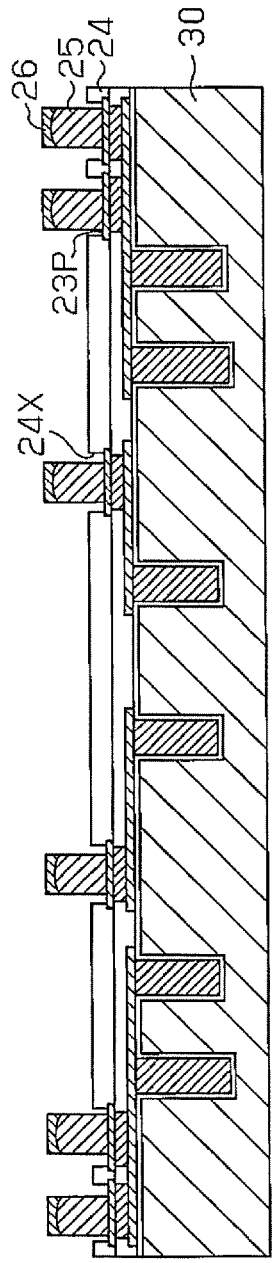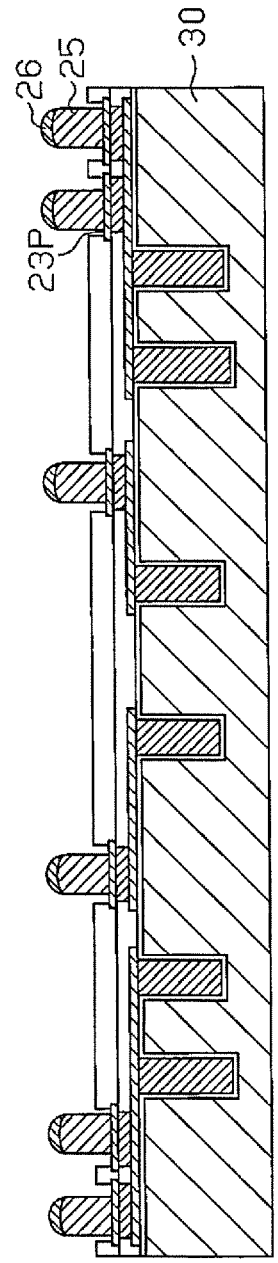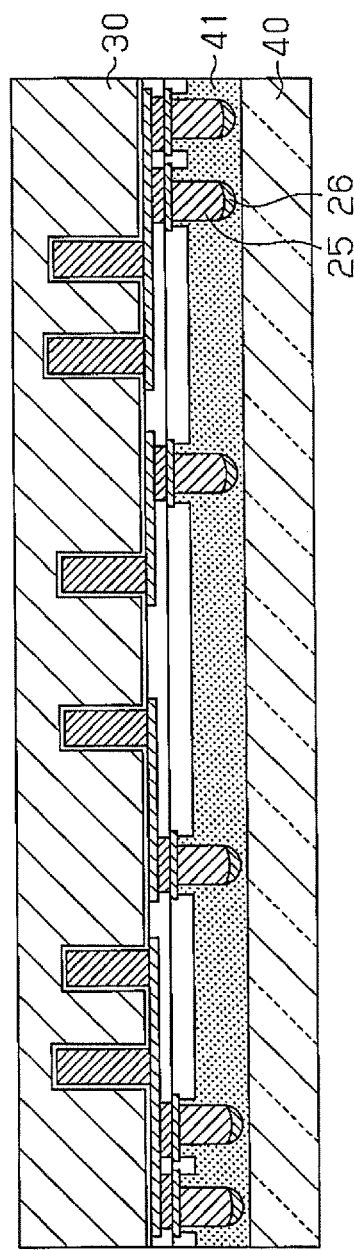

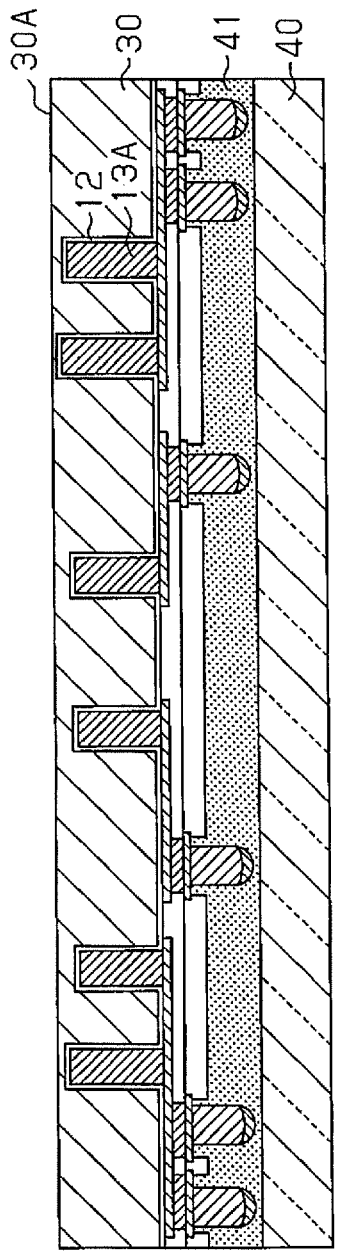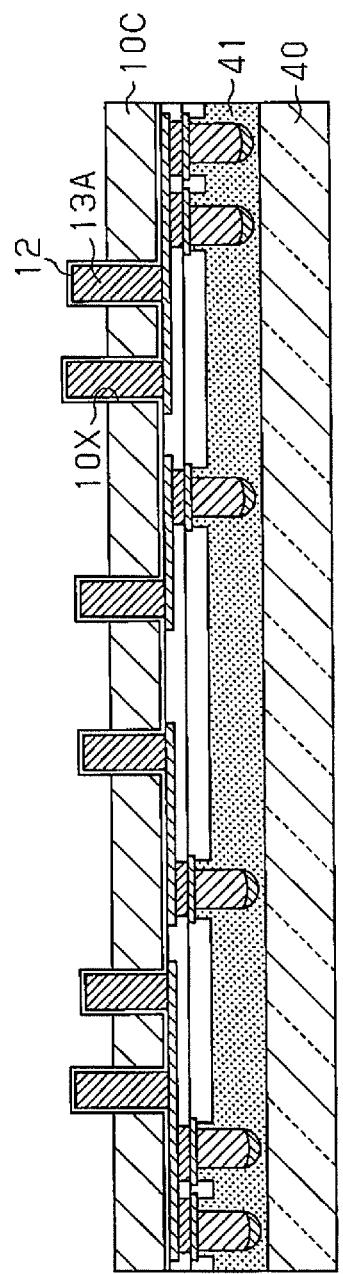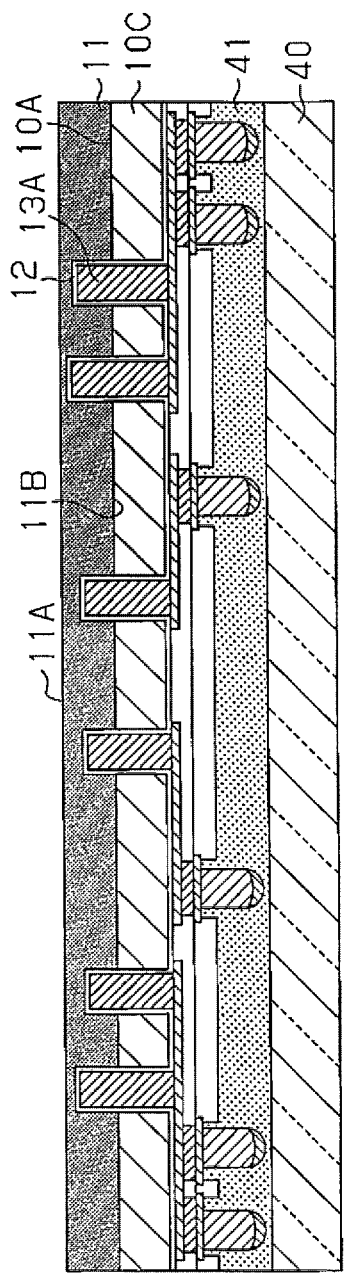

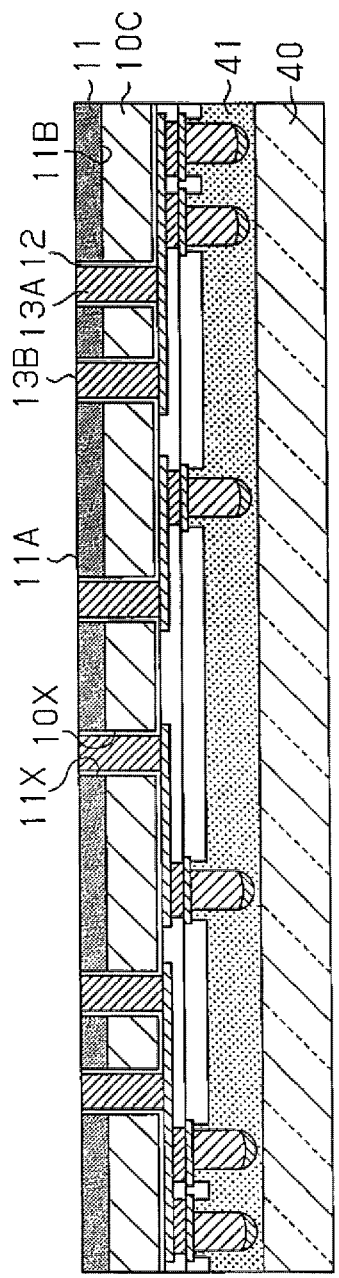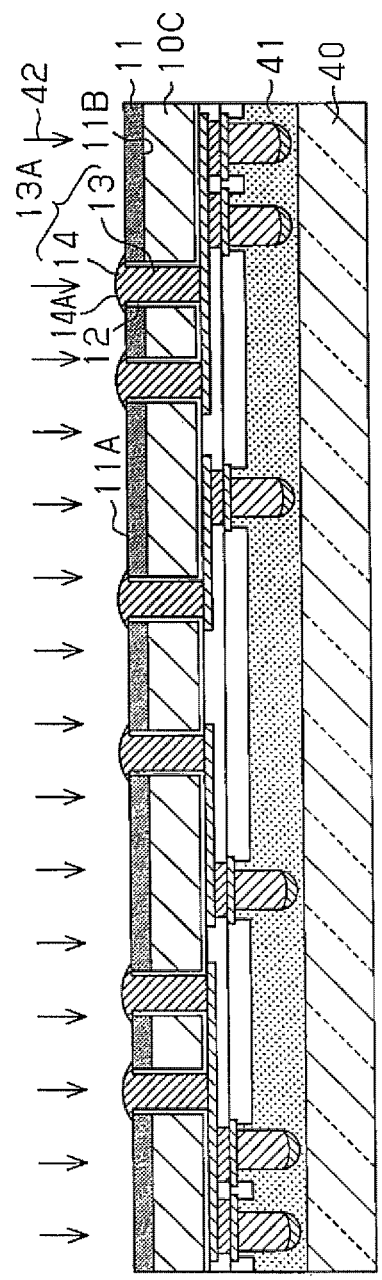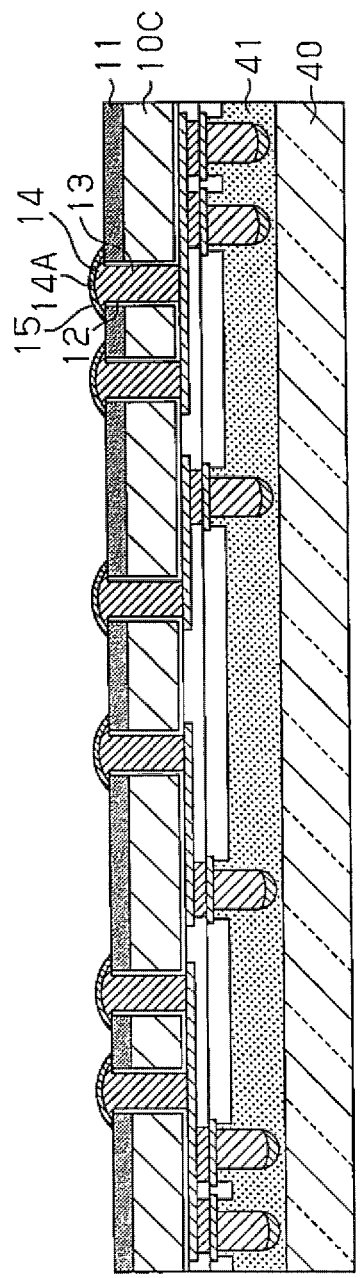

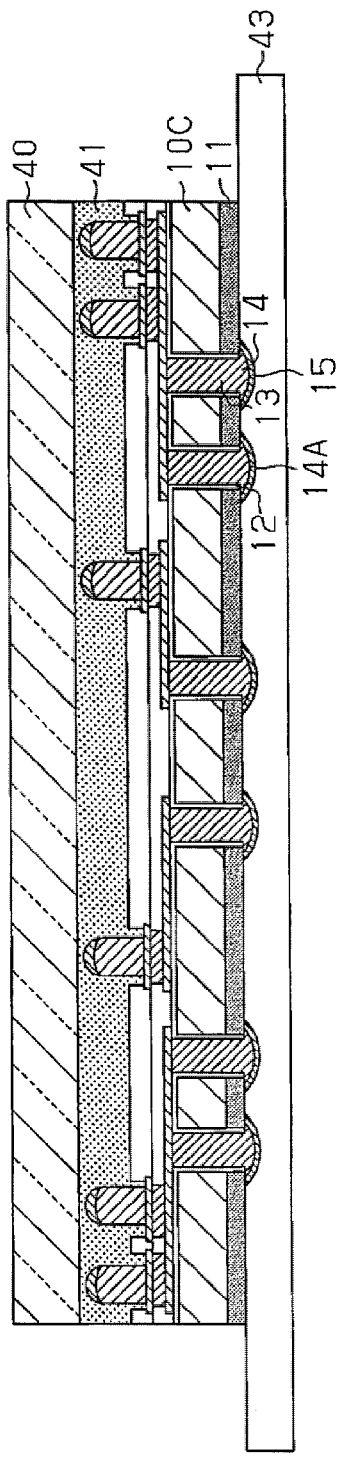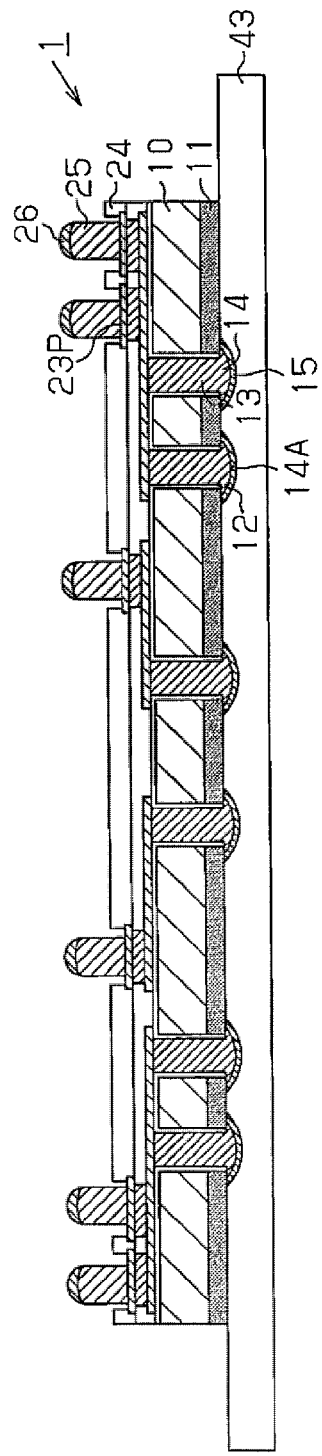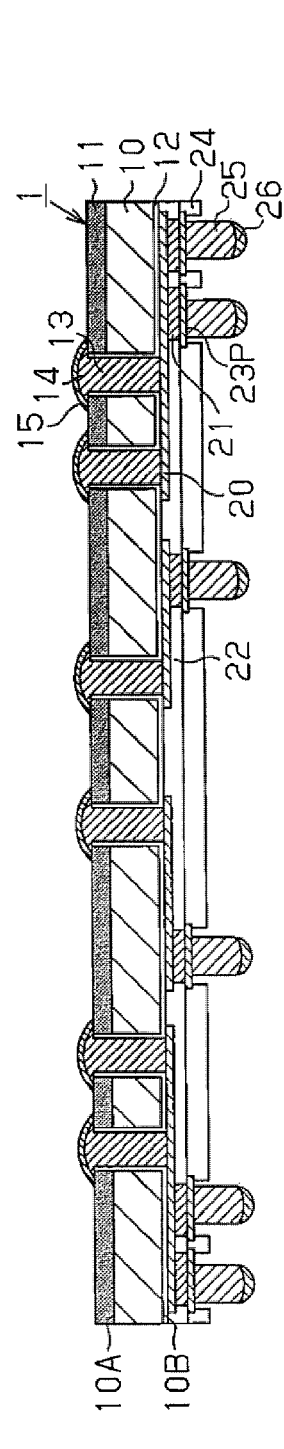

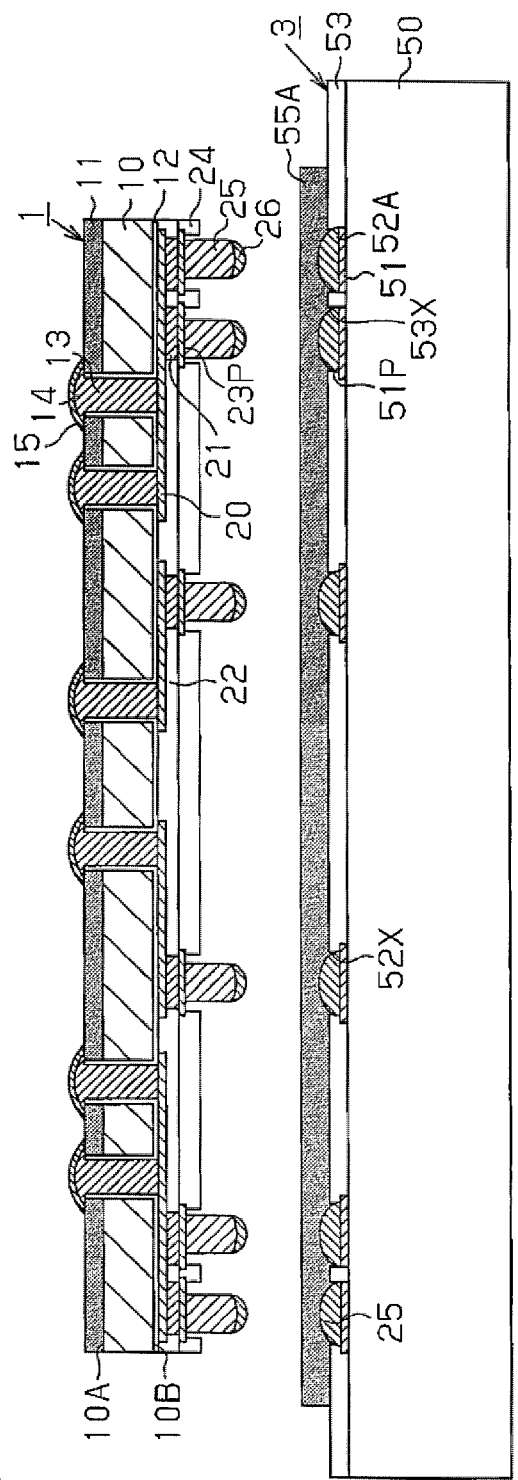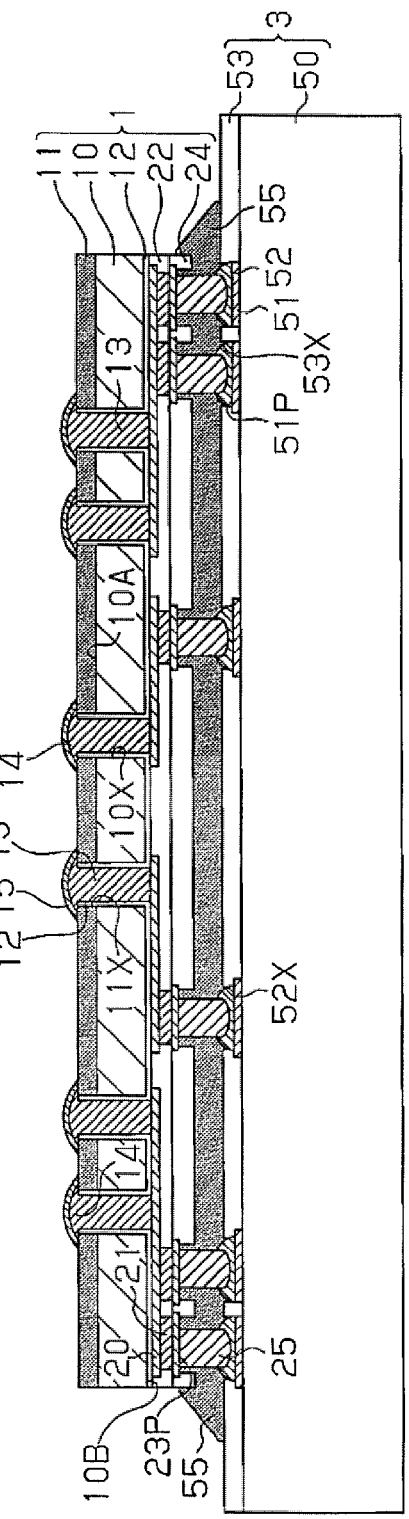

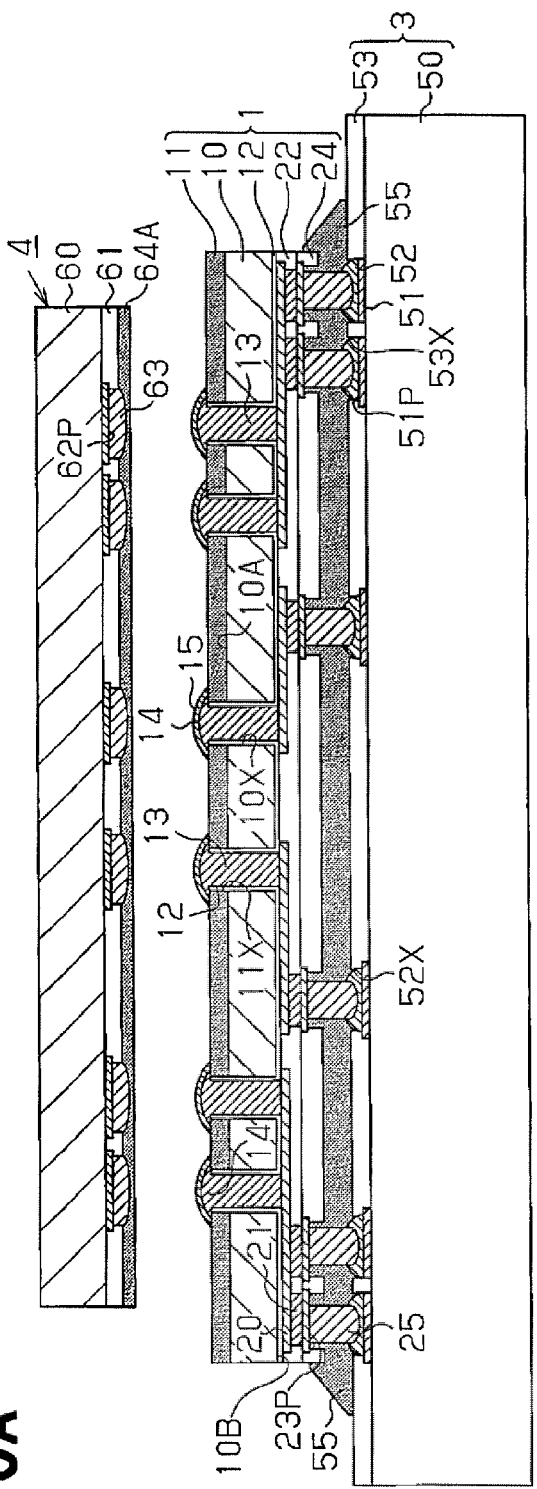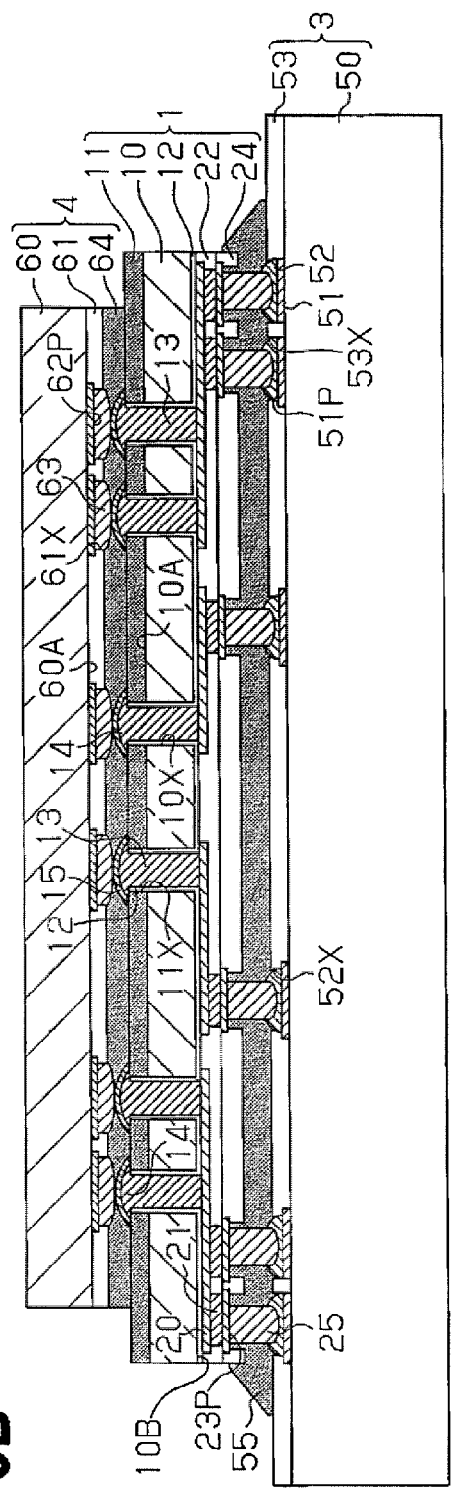

SEMICONDUCTOR DEVICE, SEMICONDUCTOR PACKAGE, AND METHOD FOR MANUFACTURING SEMICONDUCTOR DEVICE

CROSS-REFERENCE TO RELATED APPLICATIONS

This application is based upon and claims the benefit of priority from prior Japanese Patent Application No. 2011-282076, filed on Dec. 22, 2011, the entire contents of which are incorporated herein by reference.

FIELD

This disclosure relates to a semiconductor device, a semiconductor package, and a method for manufacturing a semiconductor device.

BACKGROUND

Semiconductor devices (semiconductor chips) incorporated in miniaturized and highly sophisticated electronics devices, such as integrated circuits (ICs) and large scale integration (LSI) circuits, have recently become more highly integrated and have greater capacities. Semiconductor packages, which include such semiconductor chips, are accordingly required to be miniaturized (thinner), provided with more pins, and highly densified. One packaging technique developed to meet these requirements is a system in package (SiP), which stacks multiple semiconductor chips onto a single substrate. In particular, an SiP formed using three-dimensional (3D) packaging technology that stacks semiconductor chips in a three-dimensional manner is referred to as a chip-stack package. The chip-stack package achieves higher integration of semiconductor chips and shortens the length of wires. This increases the circuit operation speed and reduces the stray capacitance of wires. The chip-stack package is now widely used.

A known 3D packaging technique used to manufacture a chip-stack package is a wiring bonding technique. This technique stacks a plurality of semiconductor chips onto a substrate and electrically connects the electrodes of the semiconductor chips to the electrodes of the substrate with bonding wires. However, the wires are thin and a chip-stack package formed with this technique has high impedance. Thus, this technique may not be applicable for high-speed semiconductor chips. Moreover, this technique requires areas in the package where wire loops are formed and thereby enlarges the package.

Japanese Laid-Open Patent Publication No. 2006-179562 describes another 3D packaging technique used to manufacture a chip-stack package. With this technique, semiconductor chips, each of which includes through electrodes, are stacked onto a substrate, and the semiconductor chips are electrically connected to one another by the through electrodes. This technique shortens the length of wires as compared with the wire bonding technique and thus reduces the size of the package.

SUMMARY

Semiconductor packages, such as the chip-stack packages described above, are incorporated in further miniaturized and thinner electronic devices and are thus required to be further densified and miniaturized. Accordingly, the wiring patterns of the semiconductor chips, in particular, the through electrodes that electrically connect the semiconductor chips to one another, are required to become smaller. However, smaller through electrodes would decrease the coupling strength between the through electrodes and the connecting terminals of another semiconductor chip which are connected to the through electrodes. This may lower the reliability of the electrical connection between the semiconductor chips.

One aspect of this disclosure is a semiconductor device including a semiconductor substrate, an insulating layer, an insulating film, a through electrode, and a first connecting terminal. The semiconductor substrate includes a first surface, a second surface, and a through hole that extends through the semiconductor substrate between the first surface and the second surface. The insulating layer covers the first surface and includes an opening at a location facing the through hole. An insulating film covers an inner wall of the through hole and an inner wall of the opening. The through electrode is formed in the through hole and the opening that are covered by the insulating film. The first connecting terminal is formed integrally with the through electrode to cover one end of the through electrode that is exposed from the insulating layer. The first connecting terminal has a larger size than the through electrode as viewed from above.

Other aspects and advantages of the embodiments will become apparent from the following description, taken in conjunction with the accompanying drawings, illustrating by way of example the principles of the invention.

BRIEF DESCRIPTION OF THE DRAWINGS

The embodiments, together with objects and advantages thereof, may best be understood by reference to the following description of the presently preferred embodiments together with the accompanying drawings in which:

FIG. 1A is a schematic cross-sectional view illustrating a semiconductor chip according to a first embodiment;

FIG. 1B is an enlarged cross-sectional view partially illustrating the semiconductor chip of FIG. 1A;

FIG. 1C is an enlarged cross-sectional view partially illustrating the semiconductor chip of FIG. 1A;

FIGS. 2A to 2D, 3A to 3C, 4A to 4C, 5A to 5C, and 6A to 6C are schematic cross-sectional views illustrating a method for manufacturing the semiconductor chip according to the first embodiment;

FIGS. 8A and 8B, 9A to 9C, and 10A and 10B are schematic cross-sectional views illustrating a method for manufacturing the semiconductor package according to the second embodiment.

DESCRIPTION OF THE EMBODIMENTS

Figure 2A:
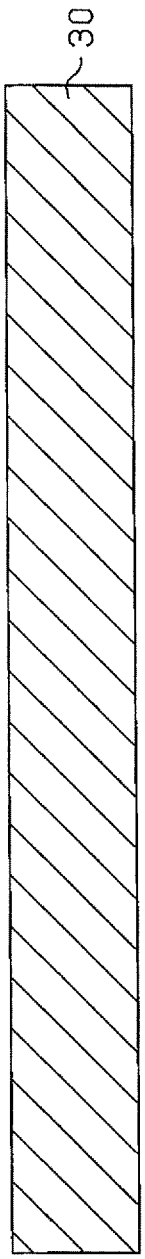

Embodiments will now be described with reference to the accompanying drawings. The drawings illustrate features in an enlarged state to ease understanding and thus do not depict actual scale. Further, to ease understanding, some of hatching lines may be removed from cross-sectional views of resin layers.

First Embodiment

A first embodiment will now be described with reference to FIGS. 1A to 6C.

[Semiconductor Chip Structure]

As illustrated in FIG. 1A, a semiconductor chip 1 (semiconductor device) includes a semiconductor substrate 10, an insulating layer 11, an insulating film 12, through electrodes 13, connecting terminals 14, a metal layer 15, a wiring pattern 20, vias 21, an insulating layer 22, electrode pads 23P, a protective film 24, and connecting terminals 25. The semiconductor chip 1 may be used as a logic device, such as a central processing unit (CPU) or a microprocessor unit (MPU).

The semiconductor substrate 10 includes through holes 10X at given locations. The through holes 10X extend through the semiconductor substrate 10 from a first surface 10A (upper surface in FIG. 1A) to a second surface 10B (lower surface in FIG. 1A). A semiconductor integrated circuit (not illustrated) is formed on the second surface 10B of the semiconductor substrate 10. Although not illustrated in the drawings, the semiconductor integrated circuit includes a diffusion layer, which is formed on the semiconductor substrate 10, an insulating layer, which is arranged on the semiconductor substrate 10, and vias and wires, which are arranged on the insulating layer. The semiconductor substrate 10 may be made of silicon (Si). The semiconductor substrate 10 may have a thickness of, for example, about 30 to 200 µm. The semiconductor substrate 10 may be obtained by singulating a thin silicon wafer.

The insulating layer 11 covers the first surface 10A of the semiconductor substrate 10. The insulating layer 11 includes openings 11X at locations corresponding to the through holes 10X. The openings 11X are in communication with the through holes 10X and have substantially the same diameter as the through holes 10X. The insulating layer 11 may be made of an insulating resin, such as epoxy resin or polyimide resin. The insulating layer 11 may also be made of insulating resin member containing fillers, such as silica or alumina. The insulating layer 11 may have a thickness of, for example, about 10 to 40 µm.

The insulating film 12 covers the second surface 10B of the semiconductor substrate 10, the inner walls of the through holes 10X, and the inner walls of the openings 11X. The insulating film 12 may be a silicon oxide film or a nitride silicon film. The insulating film 12 may have a thickness of, for example, about 0.5 to 1.0 µm.

The through electrodes 13 fill the through holes 10X and the openings 11X which are covered with the insulating film 12. The lower surfaces (lower distal surfaces) of the through electrodes 13 are substantially flush with the insulating film 12 which covers the second surface 10B of the semiconductor substrate 10. The lower surfaces of the through electrodes 13 are electrically connected to the wiring pattern 20. In one example, each through electrode 13 has a circular cross-section, and has a diameter of, for example, about 10 to 40 µm. The through electrodes 13 are arranged with a pitch of, for example, about 30 to 100 µm.

The connecting terminals 14 are formed on the upper surfaces of the through electrodes 13. In one example, the connecting terminal 14 is arranged to cover the through electrode 13, which is exposed from the insulating layer 11, and is formed integrally with the through electrode 13. The connecting terminal 14 has a larger size than the through electrode 13 as viewed from above. In one example, the connecting terminal 14 may be circular, like the through electrode 13. The connecting terminal 14 may have a diameter of, for example, about 20 to 50 µm. As illustrated in FIG. 1B, the insulating layer 11 has a first surface 11A (upper surface in FIG. 1B) and a second surface 11B (lower surface in FIG. 1B). The second surface 11B, which is located opposite to the first surface 11A, is in contact with the semiconductor substrate 10. The connecting terminals 14 partially cover the first surface 11A of the insulating layer 11. Each connecting terminal 14 on the through electrode 13 has the shape of a dome, that is, each connecting terminal 14 bulges upward from the outer side of the through electrode 13 to the center of the through electrode 13. The connecting terminal 14 may have a thickness of, for example, about 5 to 8 µm. The through electrode 13 and the connecting terminal 14 may be made of, for example, copper or copper alloy.

The connecting terminal 14 includes a surface 14A, which is a rough surface. The surface 14A of the connecting terminal 14 has a greater roughness than the lower surface of the through electrode 13. When another semiconductor chip is stacked onto the semiconductor chip 1, the connecting terminals 14 function as pads, which are electrically connected to the other semiconductor chip.

The metal layer 15 is formed on the surface 14A of each connecting terminal 14. The metal layer 15 may be, for example, a tin (Sn) layer, a silver (Ag) layer, a gold (Au) layer, a nickel (Ni)—Au layer (metal layer formed by stacking an Ni layer and an Au layer from the bottom in this order), a palladium (Pd)—Au layer (metal layer formed by stacking a Pd layer and an Au layer from the bottom in this order), or an Ni—Pd—Au layer (metal layer formed by stacking an Ni layer, a Pd layer, and an Au layer from the bottom in this order). The metal layer 15 may be formed by a pre-solder layer. The material for the pre-solder layer may be lead-free solder, such as Sn-3.5Ag solder, Sn-2.5Ag solder, Sn-3.0Ag-0.5Cu solder, or Sn—Cu solder. When the connecting terminals 14 are formed by an Ni—Au layer, the Ni—Au layer may include an Ni layer having a thickness of about 0.1 to 3.0 µm and an Au layer having a thickness of about 0.001 to 1.0 µm.

As illustrated in FIG. 1A, the wiring pattern 20 is formed on the lower surface of the insulating film 12, which covers the second surface 10B of the semiconductor substrate 10. The wiring pattern 20 has first end portions connected to the lower surfaces of the through electrodes 13 and second end portions connected by the vias 21 to the electrode pads 23P. In other words, the wiring pattern 20 and the vias 21 electrically connect the through electrodes 13 and the electrode pads 23P. The wiring pattern 20 and the vias 21 may be made of, for example, copper or copper alloy.

The insulating layer 22 is formed to cover the wiring pattern 20. The insulating layer 22 includes openings 22X at given locations that partially expose the wiring pattern 20. The vias 21 are formed in the openings 22X. The insulating layer 22 may be formed from a low dielectric material (low-k material). One example of a low dielectric material is carbon-doped silicon oxide (SiOC). Other examples include fluorine-doped silicon oxide (SiOF) and organic polymer materials. The insulating layer 22 may have a dielectric constant of, for example, about 3.0 to 3.5. The insulating layer 22 may have a thickness of, for example, about 0.5 to 2.0 µm.

A wiring layer 23 is formed on the lower surface of each via 21. Each part of the wiring layer 23 is larger in size than the corresponding via 21 as viewed from above. The wiring layer 23 may be made of, for example, aluminum (Al). The wiring layer 23 may also be made of, for example, an alloy of Cu and Al or an alloy of Cu, Al, and Si.

The protective film 24 is formed on the lower surface of the insulating layer 22. The protective film 24 covers the lower surface of the insulating layer 22 and parts of the wiring layer 23. The protective film 24 includes a plurality of openings 24X, which expose parts of the wiring layer 23 defining the electrode pads 23P. The protective film 24 protects the semiconductor integrated circuit (not illustrated), which is formed on the second surface 10B of the semiconductor substrate 10.

The protective film 24 may also be referred to as a passivation film. The protective film 24 may be, for example, a nitride silicon film or a phosphosilicate glass (PSG) film. The protective film 24 may be a laminated film including a layer of a nitride silicon film or PSG film and a polyimide layer.

The connecting terminals 25 are formed on the electrode pads 23P. The connecting terminals 25 are electrically connected to the through electrodes 13 via the wiring pattern 20 and the like and to the semiconductor integrated circuit (not illustrated). Each connecting terminal 25 is a pillar-shaped connection bump, which protrudes downward from the lower surface of the electrode pad 23P. The connecting terminal 25 may have a height of, for example, about 30 to 35 μm. The connecting terminal 25 may have a diameter of, for example, 20 to 30 μm. The connecting terminal 25 may be made of, for example, copper or copper alloy.

The metal layer 26 is formed on the lower surface of each connecting terminal 25. The metal layer 26 may be formed by performing, for example, solder plating using lead-free solder (e.g., Sn—Ag solder). The metal layer 26 may be, for example, an Au layer, an Ni—Au layer, a Pd—Au layer, or an Ni—Pd—Au layer.

In the semiconductor chip 1, the connecting terminal 14 formed on the upper surface of each through electrode 13 has a larger size than the through electrode 13 as viewed from above. This increases the surface area of each pad (connecting terminal 14) of the semiconductor chip 1 compared to when the upper surface of each through electrode 13 exposed from the insulating layer 11 is directly used as a pad. Thus, when another semiconductor chip is stacked onto the semiconductor chip 1, the area of contact between the connecting terminals of the other semiconductor chip and the pads (the connecting terminals 14) of the semiconductor chip 1 is enlarged. This increases the coupling strength between the semiconductor chips that are stacked together.

[Method for Manufacturing the Semiconductor Chip]

A method for manufacturing the semiconductor chip 1 will now be described with reference to FIGS. 2A to 6C. To simplify the description, the method will be described focusing on a single chip, although the chip is actually manufactured in batches from a wafer. Namely, a large number of semiconductor chips 1 are manufactured at the same time in a single wafer, which then undergoes singulation to obtain each semiconductor chip 1. The semiconductor integrated circuit is fabricated through a known method and thus will not be described.

In the process illustrated in FIG. 2A, a substrate 30, which serves as a base material of the semiconductor substrate 10, is prepared. The substrate 30 has a thickness (e.g., about 725 to 775 μm) that is greater than the thickness of the semiconductor substrate 10. The substrate 30 may be, for example, a silicon substrate.

Figure 2B:
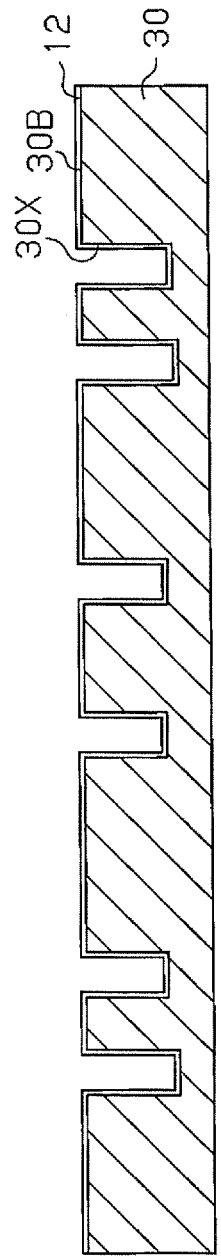

In the process illustrated in FIG. 2B, a mask (not illustrated) is formed on a second surface 30B of the substrate 30, which corresponds to the second surface 10B of the semiconductor substrate 10. The substrate 30 is etched through the openings of the mask by performing anisotropic etching, such as reactive ion etching (e.g., deep reactive ion etching (DRIE)). This forms grooves 30X in the substrate 30. The grooves 30X become the through holes 10X when the substrate 30 is thinned in the process illustrated in FIG. 4B. Thus, the grooves 30X are deeper than the through holes 10X. The grooves 30X formed in the process illustrated in FIG. 2B may have varying depths.

In the process illustrated in FIG. 2B, the mask is removed by performing, for example, ashing after the grooves 30X are formed. Subsequently, an insulating film 12 is formed to cover the second surface 30B of the substrate 30 and the inner walls of the grooves 30X. The insulating film 12 may be formed by thermally oxidizing the substrate 30 when a silicon substrate is used as the substrate 30. The insulating film 12 may also be formed by performing, for example, chemical vapor deposition (CVD).

Figure 2C:
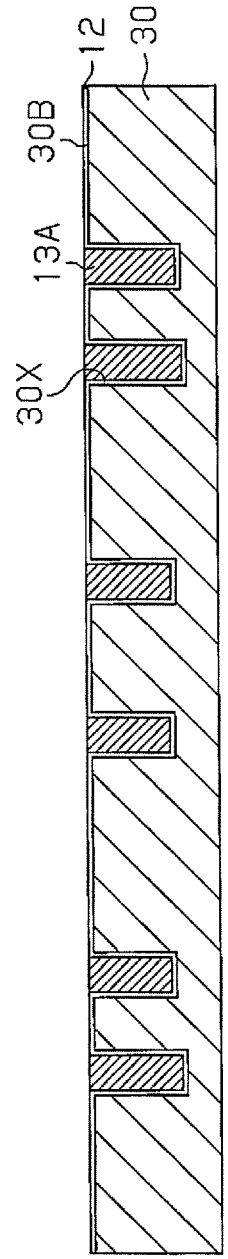

In the process illustrated in FIG. 2C, a conductive layer 13A is formed in the grooves 30X which are covered by the insulating film 12. The conductive layer 13A may be formed inside the grooves 30X by performing, for example, electroplating (e.g., copper electroplating) that uses a seed layer, which is formed through sputtering or the like, as a power layer. The conductive layer 13A may be formed by burying a conductive paste, molten metal, or metal wires in the grooves 30X.

Figure 2D:
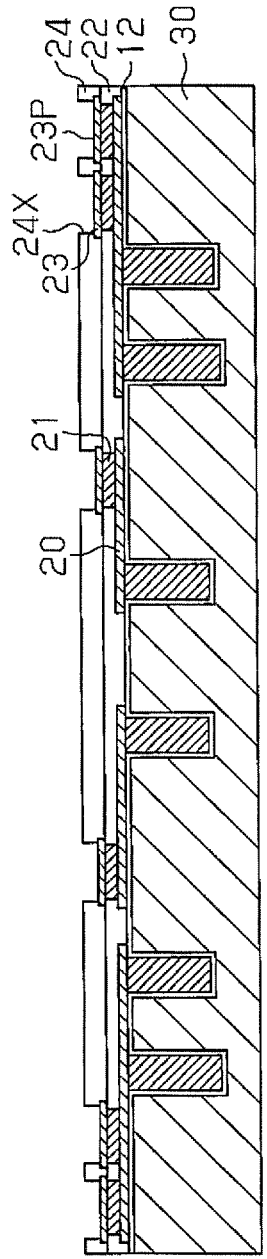

In the process illustrated in FIG. 2D, a wiring pattern 20, an insulating layer 22, vias 21, and a wiring layer 23 are sequentially formed on the upper side of the structure illustrated in FIG. 2C through methods known in the art. Subsequently, a protective film 24 is formed on the insulating layer 22 and the wiring layer 23. The protective film 24 includes openings 24X, which expose parts of the wiring layer 23 defining the electrode pads 23P. One example of how to form the protective film 24 will now be described. CVD is first performed to form the protective film 24 that covers the insulating layer 22 and the wiring layer 23. Then, a resist layer, which exposes parts of the protective film 24 that correspond to the openings 24X, is formed on the protective film 24. The parts of the protective film 24 exposed through the resist layer are removed by performing, for example, dry etching using the resist layer as a mask.

In the process illustrated in FIG. 3A, pillar-shaped connecting terminals 25, are formed on the electrode pads 23P. Then, a metal layer 26 is formed on the connecting terminals 25. One example of how to form the connecting terminals 25 will now be described. A seed layer is first formed to cover the upper surface of the protective film 24, the inner walls of the openings 24X, and the upper surfaces of the electrode pads 23P by performing, for example, sputtering. A resist layer is formed to expose parts of the seed layer corresponding to where the connecting terminals 25 are formed. Electroplating is then performed on the parts of the seed layer exposed through the resist layer by using the seed layer as a power layer. This forms the pillar-shaped connecting terminals 25 on the electrode pads 23P. When the metal layer 26 is a solder plating layer of lead-free solder (e.g., Sn—Ag solder), electroplating that uses the seed layer as a plating power layer is performed to apply the metal layer 26 (solder layer) to each connecting terminal 25. The unnecessary seed layer and resist layer are then removed.

In the process illustrated in FIG. 3B, a flux is applied to the metal layer 26. A reflow process is performed at a temperature in the range from about 230° C. to 260° C. to melt the metal layer 26. This electrically connects the metal layer 26 and the connecting terminals 25.

In the process illustrated in FIG. 3C, the structure illustrated in FIG. 3B is turned upside down, and a support 40 is adhered with an adhesive 41 to the lower surface of the structure, that is, the surface on which the connecting terminals 25 and the metal layer 26 are formed. The support 40 may be made of, for example, silicon or glass.

In the process illustrated in FIG. 4A, the substrate 30 includes a first surface 30A that is polished with, for example, a back surface polishing apparatus, to reduce the thickness of the substrate 30. In this process, the first surface 30A of the substrate 30 is polished so as not to expose the insulating film 12 and the conductive layer 13A.

In the process illustrated in FIG. 4B, the substrate 30 is further thinned until the insulating film 12 is exposed. In other words, parts of the substrate 30 (silicon substrate) are removed in a selective manner from the insulating film 12. By thinning the substrate 30, the through holes 10X, which have a given depth, are formed in the substrate 30. This obtains a substrate 10C, which corresponds to the semiconductor substrate 10 (refer to FIG. 1A), from the substrate 30. The substrate 30 may be thinned by performing, for example, wet etching, which uses a solution containing nitric acid ($HNO_3$) or hydrogen fluoride (HF) as an etching solution, or by performing plasma etching (dry etching). The insulating film 12 is not etched. Thus, the parts of the conductive layer 13A that are covered by the insulating film 12 are also exposed from the substrate 10C. In other words, by thinning the substrate 30, the conductive layer 13A covered by the insulating film 12 protrudes from a surface of the substrate 10C to expose a side wall of the conductive layer 13A with the insulating film 12.

In the process illustrated in FIG. 4C, an insulating layer 11 is formed on the first surface 10A of the substrate 10C to cover the insulating film 12 and the conductive layer 13A that are exposed from the substrate 10C. The insulating layer 11 may be made of, for example, a sheet of viscous insulating resin (e.g., a non-conductive film, or NCF), a paste of insulating resin (e.g., a non-conductive paste, or NCP), a buildup resin (e.g., an epoxy resin containing a filler), or a liquid crystal polymer. The insulating layer 11 may be made of, for example, a sheet of anisotropic viscous conductive resin (e.g., an anisotropic conductive film, or ACF) or a paste of anisotropic conductive resin (e.g., an anisotropic conductive paste, or ACP). The ACP and the ACF are formed by an insulating resin based on epoxy resin or cyanate ester resin, into which small-diameter pellets of resin coated with Ni or Au are dispersed. The ACP and ACF are conductive in the vertical direction and insulative in the horizontal direction.

One example of how to form the insulating layer 11 will now be described. The first surface 10A of the substrate 10C, the insulating film 12, and the conductive layer 13A are first coated with a film of resin, such as epoxy resin, by performing vacuum lamination. The resin film is then pressed. Subsequently, a heat treatment is performed at a temperature in the range from about 150° C. to 190° C. to cure the resin film. Alternatively, the first surface 10A of the substrate 10C, the insulating film 12, and the conductive layer 13A may be coated with a resin liquid such as epoxy resin, and a heat treatment may be performed in the range from about 150° C. to 190° C. to cure the liquid resin and form the insulating layer 11.

In the process illustrated in FIG. 5A, the insulating layer 11, the insulating film 12, and the conductive layer 13A are smoothed so that the upper surface 13B (first end surface) of the conductive layer 13A becomes flush with the first surface (upper surface) of the insulating layer 11. As a result, the upper surface 13B of the conductive layer 13A is exposed from the substrate 10C (insulating layer 11), and openings 11X are formed in the insulating layer 11. The smoothing is achieved by, for example, grinding or polishing the surfaces. In the present embodiment, the smoothing may be achieved by performing, for example, tool grinding using a grinding bit (tool), which may be made of tungsten carbide or diamond.

In the process illustrated in FIG. 5B, a blasting process is performed on the first surface (upper surface) 11A of the insulating layer 11 and the upper surface of the conductive layer 13A. The blasting process is performed by blasting polishing material (abrasive grains) against a processed subject under high pressure. The processing rate of the blasting process differs in accordance with the ductility of the material to be processed. For example, the processing rate increases when the processed material has a relatively high ductility (e.g., cured resin) and decreases when the processed material has a relatively low ductility (e.g., metal). In this process, the difference between materials in the processing rate of the blasting process is used to deform the upper surface of the conductive layer 13A and form the connecting terminals 14, which have a larger size than the conductive layer 13A as viewed from above.

For example, in FIG. 5B, abrasive grains 42 are blasted under high pressure against the upper surface of the insulating layer 11 and the upper surface of the conductive layer 13A. As a result, the insulating layer 11, which has a relatively high ductility, is ground and thinned, whereas the conductive layer 13A, which has a relatively low ductility, is not ground as much as the insulating layer 11. Thus, the impact of the abrasive grains 42 horizontally spreads the upper surface of the conductive layer 13A. In other words, the upper surface of the conductive layer 13A is deformed and spread onto the surface of the insulating layer 11. As a result, the upper surface of the conductive layer 13A that is exposed from the insulating layer 11, as viewed from above, has a larger size than the part of the conductive layer 13A where the side wall is covered by the insulating film 12. This forms the through electrodes 13, which extend through the substrate 10C and the insulating layer 11. Further, the connecting terminals 14 having a larger size than the through electrodes 13 as viewed from above is formed on the through electrodes 13. The upper surface of the conductive layer 13A exposed from the insulating layer 11, that is, the surface 14A of each connecting terminal 14, is dome-shaped. However, the surface 14A of each connecting terminal 14 does not necessarily have to be dome-shaped and may be substantially bell-shaped as illustrated in FIG. 1C. In other words, the connecting terminal 14 may gradually bulge at the peripheral part, and outer side, of the through electrode 13 and bulge more steeply than the peripheral part of the through electrode 13 at the central part of the through electrode 13. The surface 14A of the connecting terminal 14, which has been subjected to the blasting process, is roughened to include fine ridges and valleys as illustrated in FIGS. 1B and 1C. The roughness of the surface 14A of the connecting terminal 14 is greater than the roughness of the lower surface of the through electrode 13 which is not subjected to the blasting process.

The blasting process may be, for example, a wet blasting process, a dry blasting process, or a sandblasting process. The wet blasting process, which is highly accurate and efficient, is used in the present embodiment. In the wet blasting process, the polishing material, such as alumina abrasive grains or spherical silica abrasive grains, dispersed in a solvent such as water is blasted against the surface of the processed subject. The grain diameter of the polishing material, such as alumina abrasive grains or spherical silica abrasive grains, is, for example, from about 5 to 20 μm. The average grain diameter of the polishing material is, for example, about 14 μm. The concentration of the polishing material dispersed in the solvent such as water may be, for example, about 14 vol %. The pressure under which the polishing material dispersed in the solvent is blasted against the surface of the processed subject is, for example, about 0.25 MPa. In one example, the wet blasting process may be performed on the through electrodes 13 having a diameter of 20 μm and the insulating layer 11 having a thickness of 35 μm so as to grind the insulating layer 11 by 10 μm. This forms each connecting terminal 14 with a diameter of about 30 μm and a thickness from about 5 to 8 μm, for example.

In the process illustrated in FIG. 5C, the metal layer 15 is formed on the surface 14A of each connecting terminal 14. When, for example, the metal layer 15 is a Ni—Au layer, electroless plating is performed to sequentially form an Ni layer and an Au layer on the surface 14A of each connecting terminal 14. When the metal layer 15 is a pre-solder layer, a solder paste is applied to the surface 14A of each connecting terminal 14 or a solder ball is formed on the surface 14A. Then, reflow soldering is performed to form the metal layer 15 on each connecting terminal 14. When the metal layer 15 is a pre-solder layer, fine spherical solder particles (e.g., solder particles with a diameter of 10 μm or less) may be applied to the surface 14A of each connecting terminal 14, and the solder particles may be melted to form the metal layer 15 on each connecting terminal 14.

The manufacturing processes described above forms the structure corresponding to the semiconductor chip 1 on the support 40.

In the process illustrated in FIG. 6A, the structure corresponding to the semiconductor chip 1 is adhered to a dicing tape 43, which is supported by a dicing frame, and arranged so that the surface on which the connecting terminals 14 are formed faces the dicing tape 43. In the process illustrated in FIG. 6B, the adhesive 41 and the support 40, which are illustrated in FIG. 6A, are removed. Subsequently, the wafer (substrate 10C) undergoes a singulation process, in which the wafer is cut with a blade of a dicer along lines defining chip areas. The singulation of the semiconductor substrate 10C obtains the substrate 10C. As illustrated in FIG. 6C, the semiconductor chip 1, which is supported on the dicing tape 43 subsequent to dicing, is picked up and separated from the tape 43.

The present embodiment has the advantages described below.

(1) The connecting terminal 14, which has a larger size than the through electrode 13 as viewed from above, is formed on the upper surface of each through electrode 13. The surface area of the pad (connecting terminal 14) is larger than when the upper surface of each through electrode 13, which is exposed from the insulating layer 11, is used as the pad. When another semiconductor chip is stacked onto the semiconductor chip 1, the area of contact between the connecting terminals of the other semiconductor chip and the pads (connecting terminals 14) is enlarged. This increases the coupling strength between the semiconductor chips. As a result, the reliability of the electrical connection between the semiconductor chips is improved.

(2) The connecting terminal 14 is formed by performing the blasting process on the insulating layer 11 and the upper surface of the conductive layer 13A. This forms the connecting terminal 14, which has a larger size than the through electrode 13 as viewed from above, on each through electrode 13 without the need for performing resist layer patterning, plating, or other processes. Thus, the manufacturing process is simplified and manufacturing costs are reduced.

(3) The metal layer 15 is formed covering each connecting terminal 14. Without the metal layer 15, insufficient solder wettability may occur when, for example, the semiconductor chip 1 is flip-chip bonded to another semiconductor chip. The metal layer 15 covering each connecting terminal 14 prevents the reliability of the coupling from decreasing that would be caused by such insufficient solder wettability.

(4) The connecting terminal 14 includes the rough surface 14A, on which the metal layer 15 is formed. This increases the area of contact between the connecting terminal 14 and the metal layer 15 as compared with when the surface 14A of the connecting terminal 14 is a smooth surface. Thus, the adhesiveness is increased between the connecting terminal 14 and the metal layer 15, and the coupling reliability is improved between the connecting terminal 14 and the metal layer 15.

(5) The insulating layer 11, the insulating film 12, and the conductive layer 13A are thinned by performing tool grinding. The tool grinding evenly removes the insulating layer 11, the insulating film 12, and the conductive layer 13A regardless of material. As a result, the upper surface of the conductive layer 13A and the upper surface of the insulating layer 11 are substantially flush with each other and thereby obtain a smooth surface. The tool grinding is performed until the upper surface of the conductive layer 13A that is formed in the shallowest groove 30X is exposed. This prevents the grooves 30X from having varying depths. The conductive layer 13A undergoes the blasting process after the depth variations of the grooves 30X are eliminated. This reduces height variations in the connecting terminals 14 which are formed through the blasting process. As a result, the reliability of the electrical connection between the semiconductor chip 1 and another semiconductor chip is prevented from being lowered by such length variations of the connecting terminals 14.

The tool grinding uses no chemicals such as slurry which is used in chemical mechanical polishing (CMP). This reduces the cost for the disposing of waste liquid and thereby reduces manufacturing costs.

Second Embodiment

A second embodiment will now be described with reference to FIGS. 7 to 10B. A semiconductor package 2, onto which the semiconductor chip 1 described above is mounted, will be described in the second embodiment. In the second embodiment, like or same reference numerals are given to those components that are the same as the corresponding components in FIGS. 1A to 6C. Such components will not be described in detail.

[Semiconductor Package Structure]

Figure 7:
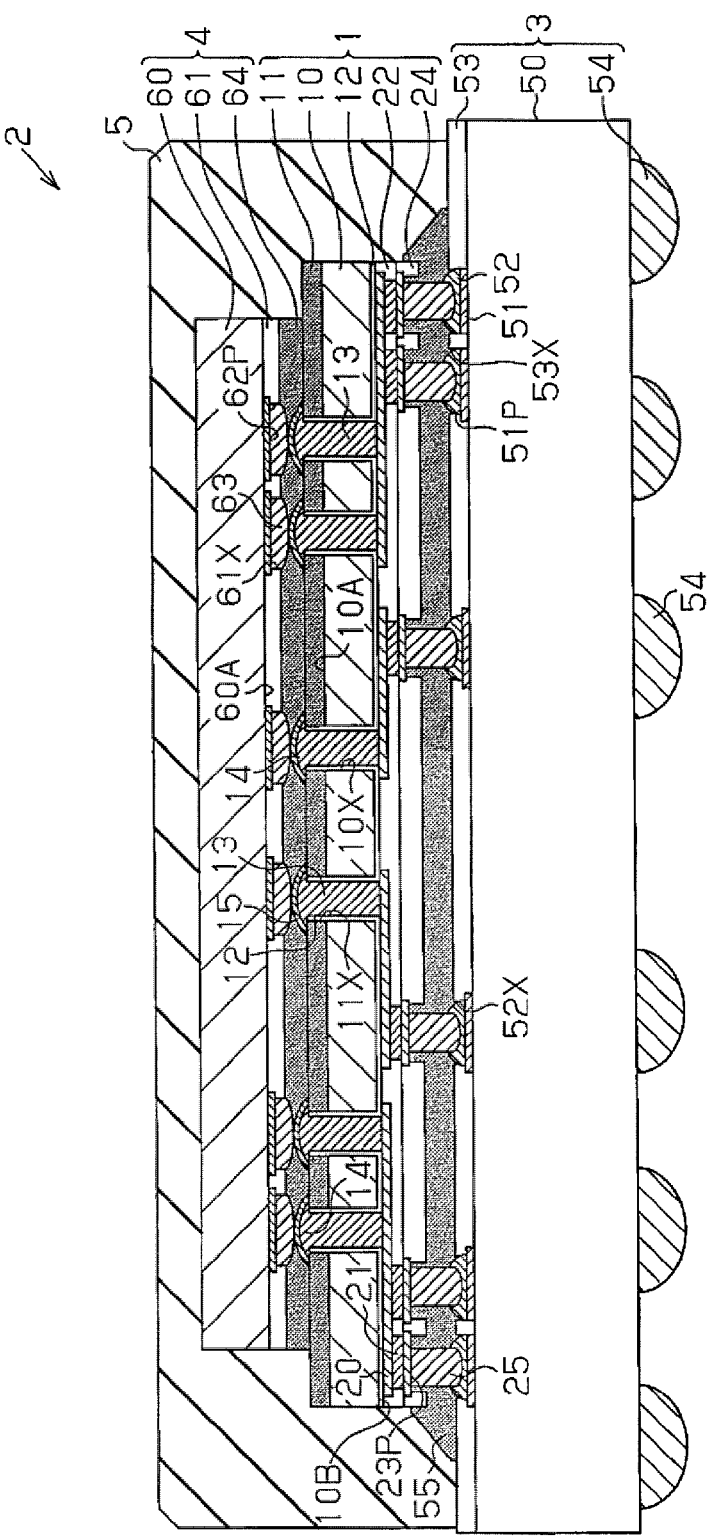
FIG. 7 is a schematic cross-sectional view illustrating a semiconductor package according to a second embodiment.

As illustrated in FIG. 7, the semiconductor package 2 includes the semiconductor chip 1 described above, a wiring substrate 3, a semiconductor chip 4, and an encapsulating resin 5. The semiconductor chip 1 is mounted on the wiring substrate 3. The semiconductor chip 4 is stacked on the semiconductor chip 1. The encapsulating resin 5 encapsulates the semiconductor chips 1 and 4, which are stacked on the wiring substrate 3. The semiconductor package 2 is a so-called chip-stack package, in which semiconductor chips, or the semiconductor chips 1 and 4, are stacked in a three-dimensional manner on the wiring substrate 3. The semiconductor chip 1 may be used as a logic device, such as a CPU or an MPU. The semiconductor chip 4 may also be used as a memory device, such as a dynamic random access memory (DRAM) or a synchronous DRAM (SDRAM).

The encapsulating resin 5 is arranged on the wiring substrate 3 to encapsulate the semiconductor chips 1 and 5, which are stacked together. The encapsulating resin 5 may be made of an insulating resin, such as epoxy resin or polyimide resin. The encapsulating resin 5 may be formed by performing, for example, transfer molding, compression molding, injection molding, potting, or the like.

Alternatively, the encapsulating resin 5 may be formed by performing printing that applies a resin paste.

[Wiring Substrate Structure]

The structure of the wiring substrate 3 will now be described.

The wiring substrate 3 includes a main substrate 50, a wiring pattern 51 of an uppermost layer, a solder resist layer 53, and solder balls 54. The wiring substrate 3 functions as an interposer, which connects the semiconductor chips 1 and 4 to a mounting board (not illustrated) such as a motherboard.

The main substrate 50 has an internal structure that allows for electrical connection of the wiring pattern 51 and the solder balls 54. The main substrate 50 may or may not include internal wiring layers. When the main substrate 50 includes internal wiring layers, the wiring layers are stacked with an interlayer insulating layer arranged in between. In this structure, the wiring layers and the interlayer insulating layers include vias, which electrically connect the wiring pattern 51 and the solder balls 54. The main substrate 50 may be, for example, a core buildup substrate containing a core substrate or a coreless substrate containing no core substrate.

The wiring pattern 51 is arranged on the mounting surface (upper surface in FIG. 7) on which the semiconductor chips 1 and 4 are mounted. The wiring pattern 51 includes electrode pads 51P. The wiring pattern 51 may be made of, for example, copper or copper alloy.

Bumps 52 are formed on the electrode pads 51P. The bumps 52 electrically connect the electrode pads 51P and the connecting terminals 25 of the semiconductor chip 1.

The solder resist layer 53 is arranged on the upper surface of the main substrate 50 to cover parts of the wiring pattern 51. The solder resist layer 53 has openings 53X, which expose parts of the wiring pattern 51 defining the electrode pads 51P. The solder resist layer 53 is made of, for example, an insulating resin, such as epoxy resin.

The solder balls 54 are formed on the lower surface of the main substrate 50. The solder balls 54 are made of, for example, an alloy containing Pb, an alloy of Sn and Cu, an alloy of Sn and Ag, or an alloy of Sn, Ag, and Cu. The solder balls 54 function as external connecting terminals, which are connected to the mounting board, such as a motherboard.

An insulating layer 55 is formed between the wiring substrate 3 and the semiconductor chip 1. The insulating layer 55 increases the coupling strength between the electrode pads 51P of the wiring substrate 3 and the connecting terminals 25 of the semiconductor chip 1. Additionally, the insulating layer 55 prevents corrosion of the wiring pattern 51 and electromigration in the wiring pattern 51 thereby preventing the reliability of the wiring pattern 51 from decreasing. The insulating layer 55 has the same function as an underfill material. The insulating layer 55 may be made of an insulating resin, such as epoxy resin or polymide resin, or an insulating resin material containing fillers, such as silica or alumina. The insulating layer 55 may have a thickness of, for example, about 10 to 100 μm.

[Upper Semiconductor Chip Structure]

The structure of the semiconductor chip 4 will now be described with reference to FIG. 7.

The semiconductor chip 4 includes a semiconductor substrate 60, a protective film 61, electrode pads 62P, connecting terminals 63, and an insulating layer 64. The semiconductor chip 4 is flip-chip bonded to the semiconductor chip 1.

A semiconductor integrated circuit (not illustrated) is formed on a first surface 60A (lower surface in FIG. 7) of the semiconductor substrate 60. Although not illustrated, the semiconductor integrated circuit includes a diffusion layer, which is formed on the semiconductor substrate 60, an insulating layer, which is arranged on the semiconductor substrate 60, and vias and wires, which are arranged on the insulating layer. The semiconductor substrate 60 may be made of, for example, silicon. The semiconductor substrate 60 may have a thickness of, for example, about 30 to 200 μm. The semiconductor substrate 60 may be obtained by singulating a thin silicon wafer.

The protective film 61 covers the first surface 60A of the semiconductor substrate 60. The protective film 61 includes openings 61X, which expose the electrode pads 62P. The protective film 61 protects the semiconductor integrated circuit (not illustrated) formed on the first surface 60A of the semiconductor substrate 60. The protective film 61 may also be referred to as a passivation film. The protective film 61 may be, for example, a nitride silicon film or a PSG film. Further, the protective film 61 may be a laminated film of, for example, a layer of a nitride silicon film or PSG film and a polyimide layer.

The electrode pads 62P are electrically connected to the semiconductor integrated circuit (not illustrated). The electrode pads 62P are formed at locations corresponding to the connecting terminals 14 of the semiconductor chip 1. When the semiconductor chip 4 is stacked on the semiconductor chip 1 illustrated in FIG. 7, the electrode pads 62P are electrically connected to the connecting terminals 14 (metal layer 15) via connecting terminals 63. The electrode pads 62P are exposed through the openings 61X, which are formed in the protective film 61. The electrode pads 62P may be made of Al, an alloy of Cu and Al, or an alloy of Cu, Al, and Si.

The connecting terminals 63 are formed on the electrode pads 62P. The connecting terminals 63 are electrically connected to the semiconductor integrated circuit (not illustrated) via the electrode pads 62P. When the semiconductor chip 4 is stacked on the semiconductor chip 1 illustrated in FIG. 7, the connecting terminals 63 are electrically connected to the through electrodes 13 via the metal layer 15 and the connecting terminals 14. The semiconductor chip 1 is electrically connected to the semiconductor chip 4 via the through electrodes 13, which are formed on the semiconductor chip 1.

The connecting terminals 63 may be formed by an Al zincate method or an electroless plating method using, for example, an Ni—Au—Sn layer, an Ni—Pd—Au—Sn layer, an Ni—Au layer, or an Ni—Pd—Au layer. Like the connecting terminals 25 and the metal layer 26 arranged in the semiconductor chip 1, the connecting terminals 63 may be formed by forming pillar-shaped connecting bumps using a solder layer. In this case, the connecting bumps may be formed by using, for example, a Cu layer. The solder layer may be made of lead-free solder, such as Sn—Ag solder.

When the semiconductor chip 4 is stacked on the semiconductor chip 1, the insulating layer 64 is formed on the lower surface of the protective film 61 to cover the connecting terminals 63 of the semiconductor chip 4, and the metal layer 15, connecting terminals 14, and through electrodes 13 of the semiconductor chip 1. The insulating layer 64 has the same function as an underfill material. The insulating layer 64 may be made of, for example, an insulating resin having the same composition as the insulating layer 11 formed as the uppermost layer of the semiconductor chip 1. The insulating layer 11 comes in contact with the insulating layer 64 when the semiconductor chip 4 is stacked on the semiconductor chip 1. Accordingly, the insulating layer 64 may be made of, for example, an insulating resin, such as epoxy resin or polyimide resin, or an insulating resin material containing fillers, such as silica or alumina. The insulating layer 64 may have a thickness of, for example, about 5 to 15 μm.

[Method for Manufacturing the Semiconductor Package]

A method for manufacturing the semiconductor package 2 will now be described.

In the process illustrated in FIG. 8A, the semiconductor chip 1 and the wiring substrate 3 are prepared. The semiconductor chip 1 is prepared through the processes described with reference to FIGS. 2A to 6C. The wiring substrate 3 may be manufactured through a known method and thus will not be described in detail. In one example, the wiring substrate 3 may be manufactured as described below.

The wiring pattern 51 is formed on the upper surface of the main substrate 50. The solder resist layer 53, which includes the openings 53X that expose parts of the wiring pattern 51 functioning as electrode pads 51P, is then formed on the wiring pattern 51. Connecting terminals 52A are formed on the electrode pads 51P. Each connecting terminal 52A may be formed by a pre-solder layer or a metal layer (surface-processed layer). The material for the pre-solder layer may be, for example, eutectic solder or lead-free solder (Sn—Ag solder, Sn—Cu solder, Sn—Ag—Cu solder, or the like). The surface-processed layer may be, for example, an Sn layer, an Au layer, an Ni—Au layer, an Ni—Pd—Au layer, or a Pd—Au layer. When a pre-solder layer is used to form each connecting terminal 52A, solder paste is applied to each electrode pad 51P or a solder ball is formed on each electrode pad 51P. Then, a reflow process is performed to form the pre-solder layer. When an Sn layer is used to form each connecting terminal 52A, the Sn layer may be formed by the electroless plating method.

The wiring substrate 3 is prepared with the processes described above.

Subsequently, an insulating layer 55A in a B-stage (semi-cured state), which covers the connecting terminals 52A, is formed on the upper surface of the wiring substrate 3. In one example, the thickness of the insulating layer 55A is set in accordance with the height of the connecting terminal 25 of the semiconductor chip 1. The thickness of the insulating layer 55A is set so that the insulating layer 55A may cover the entire surface of each connecting terminal 25 when the semiconductor chip 1 is stacked onto the wiring substrate 3. The insulating layer 55A is made of, for example, a sheet of viscous insulating resin (e.g., NCF), a paste of insulating resin (e.g., NCP), a buildup resin (epoxy resin containing a filler), or a liquid crystal polymer. The insulating layer 55A may also be made of, for example, a sheet of anisotropic conductive resin that is viscous (e.g., ACF) or a paste of anisotropic conductive resin (e.g., ACP).

When an insulating resin sheet is used for the insulating layer 55A, the insulating resin sheet is laminated on the upper surface of the wiring substrate 3. In this process, the insulating resin sheet is not thermally cured and remains in the B-stage. The insulating layer 55A is laminated in a vacuum atmosphere to prevent voids from being formed in the insulating layer 55A. When an insulating resin liquid or an insulating resin paste is used for the insulating layer 55A, the insulating resin liquid or paste is applied to the upper surface of the wiring substrate 3 by performing, for example, printing or spin coating. Subsequently, the applied insulating resin liquid or paste is prebaked to the B-stage.

In the process illustrated in FIG. 8A, the semiconductor chip 1 is arranged above the wiring substrate 3, on which the insulating layer 55A has been formed. In this process, the semiconductor chip 1 is arranged so that the surface on which the electrode pads 23P are formed faces the surface of the wiring substrate 3 on which the electrode pads 51P are formed. Further, the connecting terminals 52A are aligned with the connecting terminals 25 (metal layer 26). In the semiconductor chip 1 according to the second embodiment, the metal layer 26, which is formed on each connecting terminal 25, is a solder layer. Further, in the second embodiment, the connecting terminals 52A are also made of solder.

Subsequently, the connecting terminals 25 of the semiconductor chip 1 are flip-chip bonded to the connecting terminals 52A formed on the electrode pads 51P. The lower surface of the protective film 24, which is arranged on the semiconductor chip 1, is adhered to the insulating layer 55A, which is formed on the upper surface of the wiring substrate 3. The connecting terminals 25 and the metal layer 26, which are arranged on the semiconductor chip 1, extend out of the insulating layer 55A which is in the B-stage, and are electrically connected to the corresponding connecting terminals 52A. The bonding between the metal layer 26 and the connecting terminal 52A is achieved by, for example, heating the metal layer 26 (solder layer) and the connecting terminals 52A to a temperature in the range from about 230° C. to 260° C. and melting and solidifying the solder of the metal layer 26 and the connecting terminals 52A. The metal layer 26 and each connecting terminal 52A, which are both made of solder, are fused into an alloy. This forms a single solder bump 52 as illustrated in FIG. 8B. The connecting terminal 25 and the electrode pad 51P are electrically connected to each other via the solder bump 52. The insulating layer 55A in the B-stage is cured when heated to a curing temperature or higher for a given period of time in a heating process which is performed when or after the semiconductor chip 1 is stacked. The thermally cured insulating layer 55 covers the electrode pads 51P, the solder bumps 52, and the connecting terminals 25.

Then, the semiconductor chip 4, which is stacked onto the semiconductor chip 1, is prepared. A method for manufacturing the semiconductor chip 4 will now be described with reference to FIGS. 9A to 9C. To simplify the description, the method will be described focusing on a single chip, although the chip is actually manufactured in batches from a wafer. Namely, a large number of semiconductor chips 4 are manufactured at the same time in a single wafer, which then undergoes singulation to obtain each semiconductor chip 4. The semiconductor integrated circuit is fabricated through a known method and thus will not be described. The singulation process will not be described.

Figure 9A:
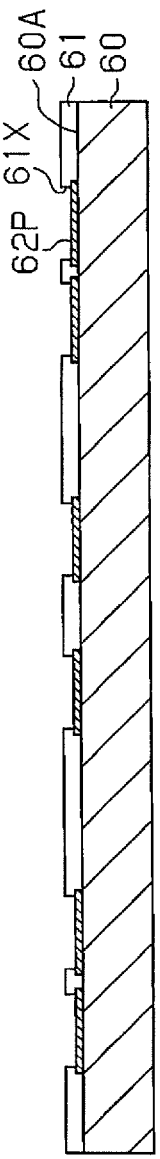

In the process illustrated in FIG. 9A, a semiconductor substrate 60, into which a semiconductor integrated circuit (not illustrated) is incorporated, is prepared through a known method. In one example, the semiconductor integrated circuit (not illustrated) is formed on the semiconductor substrate 60 through required device processes. Then, a wiring layer having a given pattern is formed on a first surface 60A (upper surface in FIG. 9A) of the semiconductor substrate 60 on which the semiconductor integrated circuit (not illustrated) has been formed. Subsequently, a protective film 61, which covers the wiring layer, is formed. Parts of the protective film 61 corresponding to the electrode pads 62P, which are defined by parts of the wiring layer, are removed. This forms openings 61X in the protective film 61. The parts of the wiring layer exposed through the openings 61X form the electrode pads 62P. The openings 61X may be formed by performing laser processing using, for example, a YAG laser or an excimer laser.

Figure 9B:
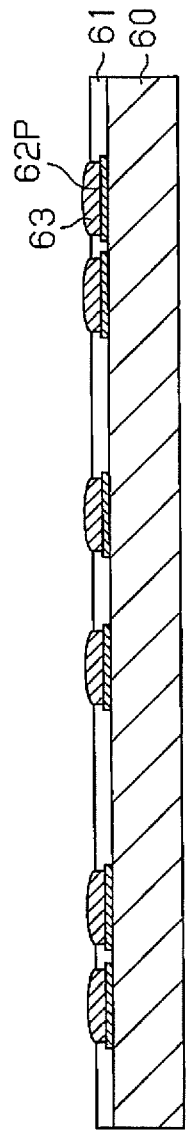

In the process illustrated in FIG. 9B, connecting terminals 63 are formed on the electrode pads 62P. When, for example, an Ni—Au—Sn layer is used to form each connecting terminal 63, the aluminum surface of each electrode pad 62P is first subjected to a zincate treatment. Subsequently, an Ni layer, an Au layer, and an Sn layer are sequentially formed on each electrode pad 62P by performing electroless plating. When a pillar-shaped connecting bump and a solder layer are used to form each connecting terminal 63, each connecting terminal 63 may be formed in the same manner as the connecting terminal 25 and the metal layer 26 (refer to FIGS. 3A and 3B).

Figure 9C:
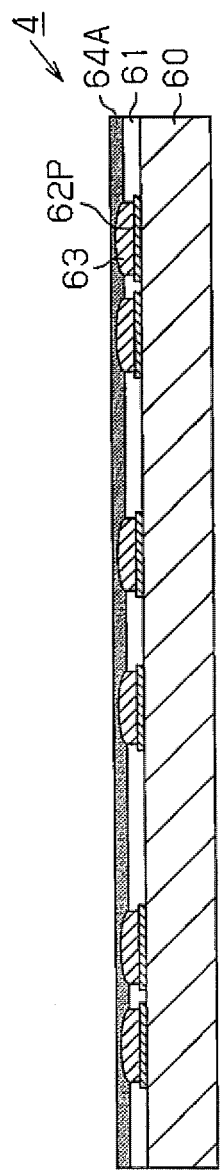

In the process illustrated in FIG. 9C, an insulating layer 64A in the B-stage is formed on the protective film 61 to cover the connecting terminals 63. The insulating layer 64A may be formed by, for example, a sheet of viscous insulating resin (e.g., NCF), an insulating resin paste (e.g., NCP), a buildup resin (epoxy resin containing a filler), or a liquid crystal polymer. The insulating layer 64A may also be formed by, for example, an anisotropic conductive resin sheet that is viscous (e.g., ACF) or an anisotropic conductive resin paste (e.g., ACP).

When an insulating resin sheet is used for the insulating layer 64A, the insulating resin sheet is laminated on the upper surface of the protective film 61. In this process, the insulating resin sheet is not thermally cured and remains in the B-stage. The insulating layer 64A is laminated in a vacuum atmosphere to prevent voids from being formed in the insulating layer 64A. When an insulating resin liquid or an insulating resin paste is used for the insulating layer 64A, the insulating resin liquid or paste is applied to the upper surface of the protective film 61 by performing, for example, printing or spin coating. Subsequently, the applied insulating resin liquid or paste is prebaked into the B-stage. The semiconductor chip 4 according to the second embodiment is manufactured through the processes described above.

In the process illustrated in FIG. 10A, the semiconductor chip 4 is arranged above the semiconductor chip 1 on which the connecting terminals 14 covering the upper surfaces of the through electrodes 13 have been formed. In this process, the semiconductor chip 1 is arranged so that the surface on which the connecting terminals 14 are formed faces the surface of the semiconductor chip 4 on which the electrode pads 62P are formed. Further, the metal layer 15 on the connecting terminals 14 are aligned with the connecting terminals 63 on the electrode pads 62. The connecting terminal 14 and the metal layer 15 are each larger than the through electrode 13 as viewed from above. Thus, the alignment is facilitated compared to when the through electrodes 13 are directly connected to the connecting terminals 63.

In the process illustrated in FIG. 10B, the connecting terminals 63 of the semiconductor chip 4 are flip-chip bonded to the connecting terminals 14 (metal layer 15) on the through electrodes 13. The lower surface of the insulating layer 64A of the semiconductor chip 4 is adhered to the upper surface of the insulating layer 11 of the semiconductor chip 1. Each connecting terminal 63 of the semiconductor chip 4 extends out of the insulating layer 64A in the B-stage and comes into contact with the metal layer 15 of the semiconductor chip 1. As a result, the connecting terminals 14 and 63 are electrically connected via the metal layer 15. The connecting terminal 14 and the metal layer 15 each have a larger size than the through electrode 13 as viewed from above. Thus, the area of contact between the connecting terminal 63 and the metal layer 15 is larger than when the through electrode 13 comes into direct contact with the connecting terminal 63. This increases the coupling strength between the metal layer 15 and the connecting terminals 63 and improves the electrical connection reliability between the semiconductor chips 1 and 4.

When solder is used for at least either one of the metal layer 15 or the connecting terminal 63, the solder is melted and solidified to electrically connect the metal layer 15 and the connecting terminal 63. Further, when ACF or ACP is used for the insulating layer 64A, the insulating layer 64A (ACF or ACP) is pressurized between the connecting terminal 63 and the connecting terminal 14 (metal layer 15). As a result, the insulating layer 64A between the metal layer 15 and the connecting terminal 63, which is pressurized strongly, becomes conductive in the thicknesswise direction. This electrically connects the metal layer 15 and the connecting terminal 63.

When the connecting terminals 14 and 63 are electrically connected via the metal layer 15, the electrode pads 62P of the semiconductor chip 4 are electrically connected to the through electrodes 13 via the connecting terminals 63 and 14. As a result, the electrode pads 62P of the semiconductor chip 4 are electrically connected to the electrode pads 51P of the wiring substrate 3 via the through electrodes 13 or the like. The insulating layer 64A in the B-stage is then subjected to the heating process performed when or after the semiconductor chip 4 is mounted, in which the insulating layer 64A is heated to and cured at the curing temperature or higher. This bonds the lower surface of the thermally cured insulating layer 64 and the upper surface of the insulating layer 11. The thermally cured insulating layer 64 covers the through electrodes 13, the connecting terminals 14 and 63, the metal layer 15, the electrode pads 62P, and the like. The insulating layer 64 is formed from the same material as the insulating layer 11, which is located under the insulating layer 64. This reduces delamination at the interface between the insulating layer 64 and the insulating layer 11 that would be caused by differing physical properties (e.g., the coefficient of thermal expansion) between the materials of the insulating layers 64 and 11.

Subsequently, the encapsulating resin 5 for encapsulating the semiconductor chips 1 and 4, which have been stacked on the wiring substrate 3, is formed. When a heat curable resin is used as the encapsulating resin 5, the structure illustrated in FIG. 10B is placed in a mold, the interior of the mold is pressurized (e.g., 5 to 10 MPa), and fluidized resin is charged into the mold. The resin is then heated at, for example, about 180° C. This cures the resin and forms the encapsulating resin 5. Subsequently, the solder balls 54 are formed on the lower surface of the wiring substrate 3. This completes the semiconductor package 2.

The second embodiment has the advantages described below in addition to advantages (1) to (5) described in the first embodiment.

(6) The semi-cured insulating layer 64A is formed on the lower surface (surface facing the semiconductor chip 1) of the semiconductor chip 4. After the semiconductor chip 4 is stacked onto the semiconductor chip 1, the insulating layer 64A is thermally cured to form the insulating layer 64. The resulting insulating layer 64 has the same function as an underfill material. The semi-cured insulating layer 64A is deformed to cover the connecting terminals 14 and 63, the metal layer 15, and the electrode pads 62P and the like when the semiconductor chip 4 is stacked onto the semiconductor chip 1. This prevents the formation of voids, which would be formed when an underfill material is filled. This method also eliminates the process for filling an underfill material.

(7) The insulating layer 64 is formed from the insulating resin having the same composition as the material used for the insulating layer 11, which is located under the insulating layer 64. This prevents delamination of the layers occurring at the interface between the insulating layers 64 and 11, which may occur due to differing physical properties (e.g., the coefficient of thermal expansion) between the materials of the insulating layers 64 and 11.

It should be apparent to those skilled in the art that the aforementioned embodiment may be embodied in many other specific forms without departing from the spirit or scope of the invention. Particularly, it should be understood that the invention may be embodied in the following forms.

In the above embodiments, the insulating layer 11, the insulating film 12, and the conductive layer 13A are thinned (refer to FIG. 5A) by performing tool grinding. Alternatively, the insulating layer 11, the insulating film 12, and the conductive layer 13A may be thinned by using, for example, a chemical mechanical polishing (CMP) device.

Alternatively, when the grooves 30X formed in the process illustrated in FIG. 2B have depths that do not vary much, the process illustrated in FIG. 5A, that is, the process for thinning the insulating layer 11, the insulating film 12, and the conductive layer 13A may be eliminated.

In the second embodiment, when the upper and lower semiconductor chips 1 and 4 are stacked, the insulating layer 64A in the B-stage is formed on the lower surface of the semiconductor chip 4, and the insulating layer 64A is thermally cured after the semiconductor chip 4 is stacked onto the semiconductor chip 1. As a result, the thermally cured insulating layer 64 has the same function as an underfill material. Alternatively, an underfill material may be filled between the semiconductor chips 1 and 4 after the semiconductor chip 4 is stacked onto the semiconductor chip 1.

In the second embodiment, the types of semiconductor chips and the number of semiconductor chips stacked on the wiring substrate 3 are not limited. For example, the semiconductor chips stacked on the wiring substrate 3 may all be memory devices. Further, three or more semiconductor chips may be stacked on the wiring substrate 3.

In the second embodiment, the wiring substrate 3 is a ball grid array (BGA) wiring substrate. However, the wiring substrate 3 may be another wiring substrate, such as a pin grid array (PGA) wiring substrate or a land grid array (LGA) wiring substrate.

The present examples and embodiments are to be considered as illustrative and not restrictive, and the invention is not to be limited to the details given herein, but may be modified within the scope and equivalence of the appended claims.

The invention claimed is:

1. A semiconductor device comprising:
a semiconductor substrate including an upper surface, a lower surface, and a through hole that extends through the semiconductor substrate between the upper surface and the lower surface, wherein the lower surface is an active surface on which a semiconductor integrated circuit is formed;
a first insulating layer formed from an organic insulting resin, covering the upper surface of the semiconductor substrate, and including an opening at a location corresponding to the through hole, wherein the opening of the first insulting layer has a diameter that is the same as a diameter of the through hole;
an insulating film formed from an inorganic insulating film and covering an inner wall of the through hole, an inner wall of the opening of the first insulating layer, and the lower surface of the semiconductor substrate;
a through electrode formed in the through hole and the opening that are covered by the insulating film, wherein the through electrode has a lower end surface that is flush with a lower surface of the insulating film at a side of the lower surface of the semiconductor substrate;
a wiring pattern formed on the lower end surface of the through electrode at the side of the lower surface of the semiconductor substrate;
a second insulating layer covering the wiring pattern; and
a first connecting terminal integrally formed with the through electrode and defined by an upper end portion of the through electrode that is exposed and protrudes from an upper surface of the first insulating layer, wherein
the upper end portion of the through electrode is spread on the upper surface of the first insulating layer so that the first connecting terminal includes an upper end surface that has a larger size than the diameter of the through hole as viewed from above to be in contact with the upper surface of the first insulating layer,
the upper end surface of the first connecting terminal is a roughened surface that has a greater roughness than the lower end surface of the through electrode, and
the semiconductor device further comprises a metal layer covering the first connecting terminal.

2. The semiconductor device according to claim 1, wherein the first connecting terminal is dome-shaped or bell-shaped to bulge upward from an outer side of the through electrode to a center of the through electrode.

3. The semiconductor device according to claim 1, further comprising
a second connecting terminal electrically connected to the through electrode via the wiring pattern.

4. The semiconductor device according to claim 3, wherein the second connecting terminal is a pillar-shaped bump.

5. A semiconductor package comprising:
a first semiconductor device including
a semiconductor substrate including an upper surface, a lower surface, and a through hole that extends through the semiconductor substrate between the upper surface and the lower surface, wherein the lower surface is an active surface on which a semiconductor integrated circuit is formed,
a first insulating layer formed from an organic insulating resin, covering the upper surface of the semiconductor substrate, and including an opening at a location corresponding to the through hole, wherein the opening of the first insulating layer has a diameter that is the same as a diameter of the through hole,
an insulating film formed from an inorganic insulating film and covering an inner wall of the through hole, an inner wall of the opening of the first insulating layer, and the lower surface of the semiconductor substrate,
a through electrode formed in the through hole and the opening that are covered by the insulating film, wherein the through electrode has a lower end surface that is flush with a lower surface of the insulating film at a side of the lower surface of the semiconductor substrate,
a wiring pattern formed on the lower end surface of the through electrode at the side of the lower surface of the semiconductor substrate,
a second insulating layer covering the wiring pattern, and
a first connecting terminal integrally formed with the through electrode and defined by an upper end portion of the through electrode that is exposed and protrudes from an upper surface of the first insulating layer, wherein
the upper end portion of the through electrode is spread on the upper surface of the first insulating layer so that the first connecting terminal includes an upper end surface that has a larger size than the diameter of the through hole as viewed from above to be in contact with the upper surface of the first insulating layer,
the upper end surface of the first connecting terminal is a roughened surface that has a greater roughness than the lower end surface of the through electrode, and
the semiconductor device further includes a metal layer covering the first connecting terminal; and
a second semiconductor device bonded to the metal layer.

6. The semiconductor package according to claim 5, wherein the first connecting terminal is dome-shaped or bell-shaped to bulge upward from an outer side of the through electrode to a center of the through electrode.

7. The semiconductor package according to claim 5, further comprising
a second connecting terminal electrically connected to the through electrode via the wiring pattern.

8. The semiconductor package according to claim 7, wherein the second connecting terminal is a pillar-shaped bump.

* * * * *